US011867727B2

(12) United States Patent
Battistella et al.

(10) Patent No.: US 11,867,727 B2
(45) Date of Patent: Jan. 9, 2024

(54) DEVICE FOR MEASURING THE ELECTRIC POWER DRAWN BY A RAILWAY VEHICLE FROM A HIGH-VOLTAGE ELECTRIC SUPPLY LINE

(71) Applicant: MICROELETTRICA SCIENTIFICA S.P.A., Milan (IT)

(72) Inventors: Denis Battistella, Paderno Dugnano (IT); Alessandro Chianese, Garbagnate Milanese (IT); Valter Lovati, Milan (IT)

(73) Assignee: MICROELETTRICA SCIENTIFICA S.P.A.

( * ) Notice: Subject to any disclaimer, the term of this patent is extended or adjusted under 35 U.S.C. 154(b) by 200 days.

(21) Appl. No.: 17/422,162

(22) PCT Filed: Jan. 8, 2020

(86) PCT No.: PCT/EP2020/050263
§ 371 (c)(1),
(2) Date: Jul. 9, 2021

(87) PCT Pub. No.: WO2020/144205
PCT Pub. Date: Jul. 16, 2020

(65) Prior Publication Data
US 2022/0113336 A1    Apr. 14, 2022

(30) Foreign Application Priority Data

Jan. 9, 2019    (EP) ..................................... 19150985

(51) Int. Cl.
*B60L 3/12*        (2006.01)
*G01R 15/04*      (2006.01)
(Continued)

(52) U.S. Cl.
CPC ................ *G01R 15/04* (2013.01); *B60L 3/12* (2013.01); *G01R 21/06* (2013.01); *G01R 31/008* (2013.01); *B60L 2200/26* (2013.01)

(58) Field of Classification Search
CPC ........ G01R 15/04; G01R 21/06; G01R 21/08; G01R 21/133; G01R 31/008; G01R 35/00; B60L 3/12; B60L 2200/26
See application file for complete search history.

(56) References Cited

U.S. PATENT DOCUMENTS

2003/0228503 A1    12/2003    Georgii
2014/0266127 A1     9/2014    Sun

FOREIGN PATENT DOCUMENTS

CN    203909129 U    10/2014
CN    108562786 A     9/2018
(Continued)

OTHER PUBLICATIONS

International Search Report and Written Opinion corresponding to PCT/EP2020/050263 dated Apr. 7, 2020.
(Continued)

*Primary Examiner* — Tarun Sinha
*Assistant Examiner* — James I Burris
(74) *Attorney, Agent, or Firm* — Barnes & Thornburg LLP

(57) ABSTRACT

A device includes a plurality of resistive voltage dividers connected operationally between a supply line and an electric grounding terminal so as to form separate respective connection paths to the electrical grounding terminal, and a processing assembly connected to the outputs of the voltage dividers and designed to generate signals or data indicating the voltage of the supply line. The processing assembly includes a plurality of separate processing modules each one coupled to a respective one of the connection paths and (Continued)

designed to generate respective signals or data indicating the voltage of the supply line.

7 Claims, 4 Drawing Sheets

(51) Int. Cl.
　　　*G01R 21/06*　　　(2006.01)
　　　*G01R 31/00*　　　(2006.01)

(56) References Cited

FOREIGN PATENT DOCUMENTS

| EP | 1882954 A1 | 1/2008 | |
|---|---|---|---|
| EP | 2156529 A1 * | 2/2010 | ............. G01R 15/04 |
| EP | 2156529 A1 | 2/2010 | |
| EP | 3308174 A1 | 4/2018 | |
| JP | 5955507 A | 7/2016 | |
| JP | 2018125991 A | 8/2018 | |
| WO | 2016203360 A1 | 12/2016 | |
| WO | WO-2016203360 A1 * | 12/2016 | ................ B60L 3/00 |
| WO | 2017079143 A1 | 5/2017 | |

OTHER PUBLICATIONS

Extended European Search Report corresponding to EP19150985.0 dated Jul. 29, 2019.

* cited by examiner

DEVICE FOR MEASURING THE ELECTRIC POWER DRAWN BY A RAILWAY VEHICLE FROM A HIGH-VOLTAGE ELECTRIC SUPPLY LINE

PRIORITY CLAIM AND CROSS REFERENCE

This patent application is a U.S. National Phase of International Patent Application No. PCT/EP2020/050263 filed Jan. 8, 2020, which claims priority to European Patent Application No. 19150985.0, the disclosure of which being incorporated herein by reference in their entireties.

FIELD

Disclosed embodiments relate to a device for measuring the electric power delivered to a railway vehicle by a high-voltage electric supply line. More specifically, disclosed embodiments relate to an improved device for measuring the electrical power drawn by a railway vehicle.

BACKGROUND

A device for measuring the electric power delivered to a railway vehicle by a high-voltage electric supply line is described for example in European patent application EP 1 882 954 A1. In the device described in the document, current sensor, a voltage divider and processor related thereto are seated in an upper cavity (or high-voltage area) inside the insulator, separated by a second cavity (or low-voltage area) formed in the lower portion of the same insulator, which furthermore contains an electrical-to-optical energy converter designed to send power to the processor, as well as optical/electrical converters that provide signals/data indicating the voltage and relevant current.

European patent application EP 3 308 174 A1 discloses a device for measuring the electric power drawn by a railway vehicle from a high-voltage electric supply line including a current sensor connected to the supply line, a resistive voltage divider connected between the line and earth, first processing devices connected to the current sensor, second processing devices connected to the output of the voltage divider. The current sensor, related processing devices and the voltage divider, are seated in a cavity inside a line insulator. The terminal with the lowest potential of the voltage divider is connected to a conductive member that extends outside the cavity of the insulator. A hollow conductive body, connected to earth contains the second processing devices and is connected to the lower end of the insulator. It includes a wall arranged opposite the member to form a discharger with it.

SUMMARY

Disclosed embodiments provide a device for measuring the electrical power drawn by a railway vehicle, while improving the measurement of the voltage of the supply line as well as the robustness of the device against faults.

Further disclosed embodiments provide high levels of safety, even in the presence of significant surge voltages.

BRIEF DESCRIPTION OF FIGS

Further characteristics and advantages of the disclosed embodiments are set out in the detailed description below, provided purely as a non-limiting example, with reference to the attached drawings, in which.

DETAILED DESCRIPTION

Figure 1:
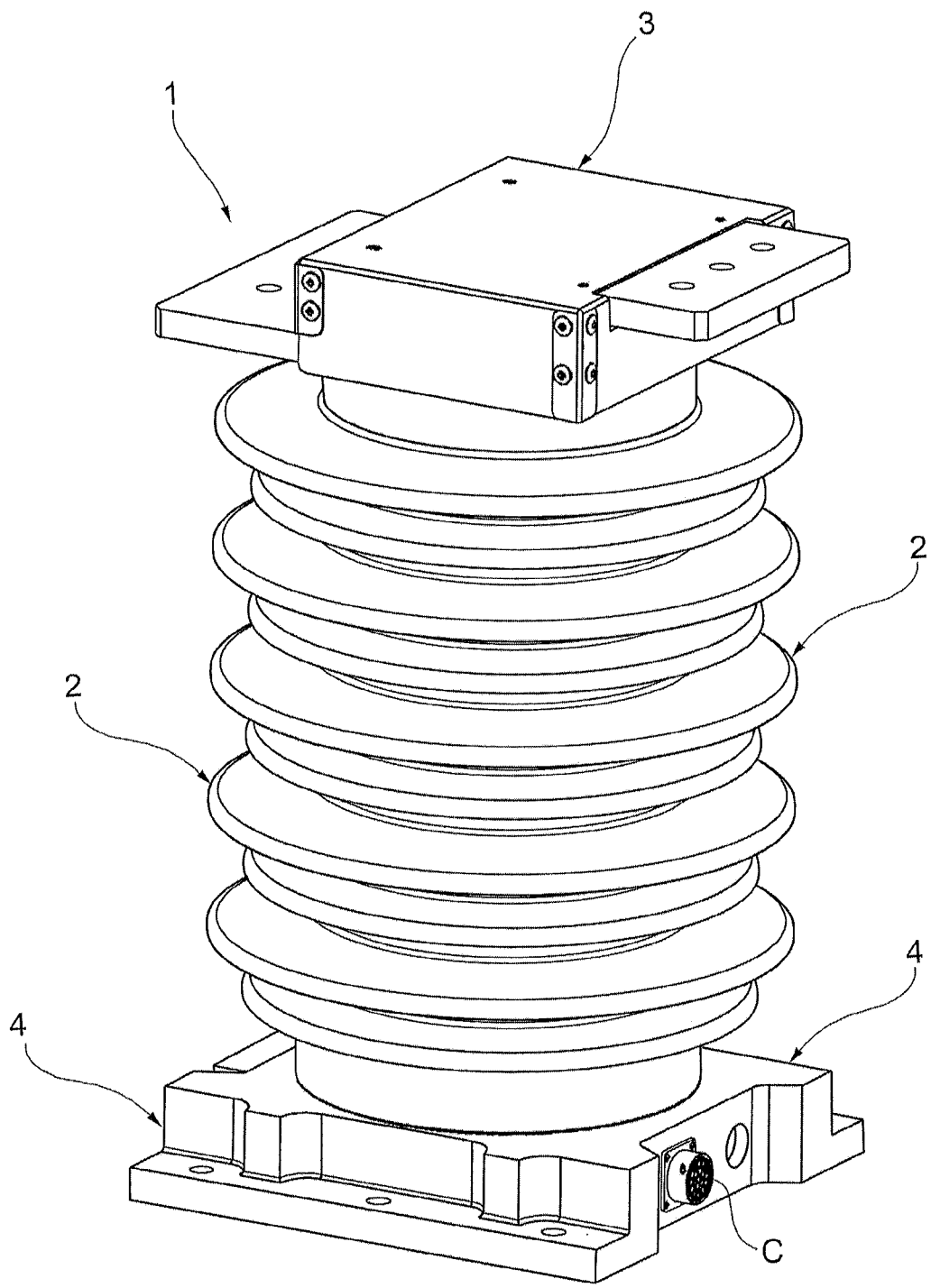
FIG. 1 is a perspective view of an electrical-power measuring device according to the prior art.

Disclosed embodiments provide a device for measuring the electrical power drawn from the high-voltage electric supply line, in accordance with prevailing standards and in particular standard EN50463.

In the drawings, reference sign 1 indicates a device as a whole for measuring the electrical power delivered from a high-voltage electric supply line to a railway vehicle. The electric supply line is for example a 25 kV AC (50 Hz) line, or a 15 kV AC (16+⅔ Hz) line, or a 3 kV DC line. In the example shown, the measuring device 1 includes a conventional line insulator 2 on top of which is mounted an upper container indicated as a whole using reference sign 3 and at the base of which is attached a lower base or container 4.

Figure 2:
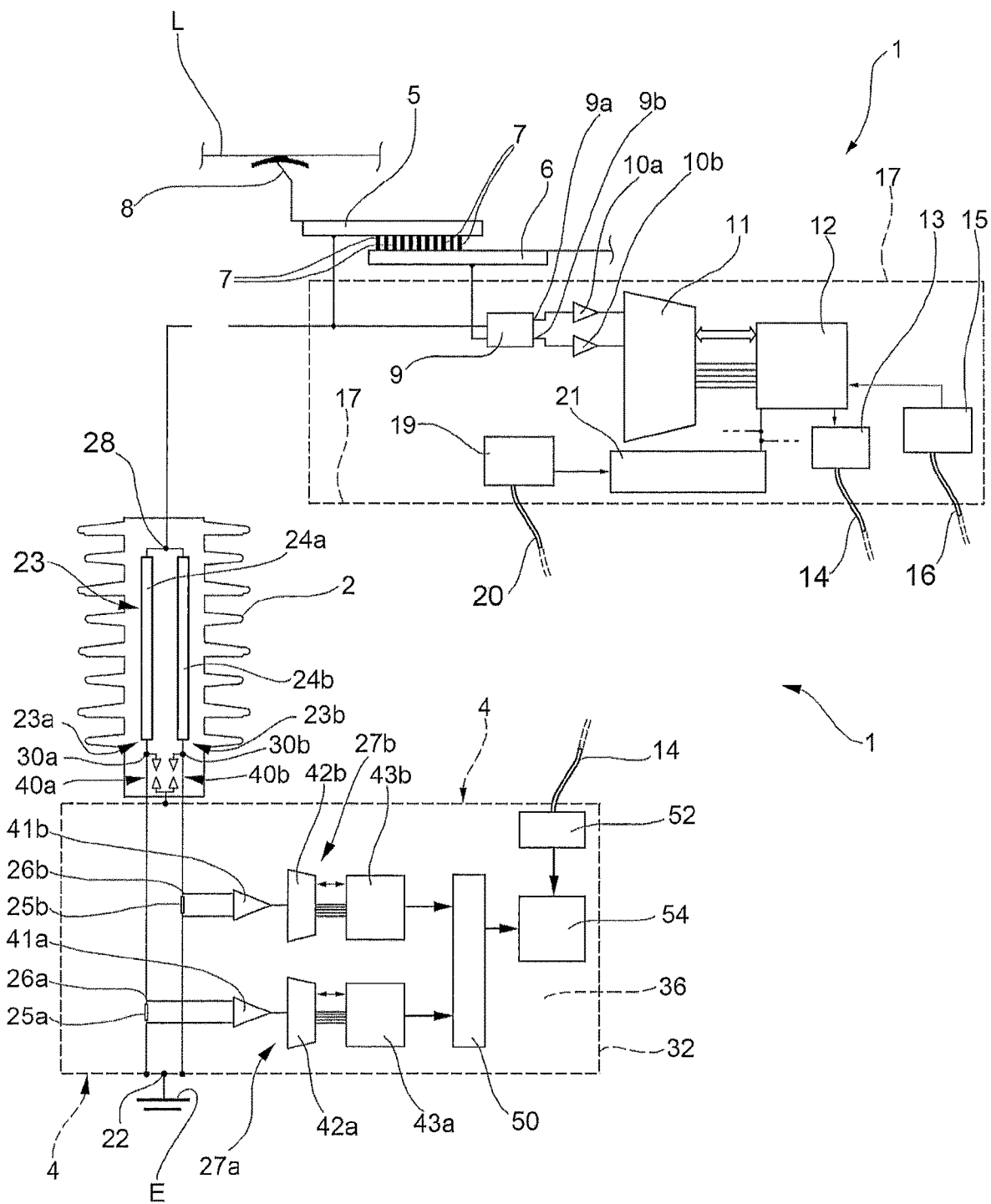
FIG. 2 is a circuit diagram partially with blocks showing a measuring device according to the disclosed embodiments.
Figure 3:
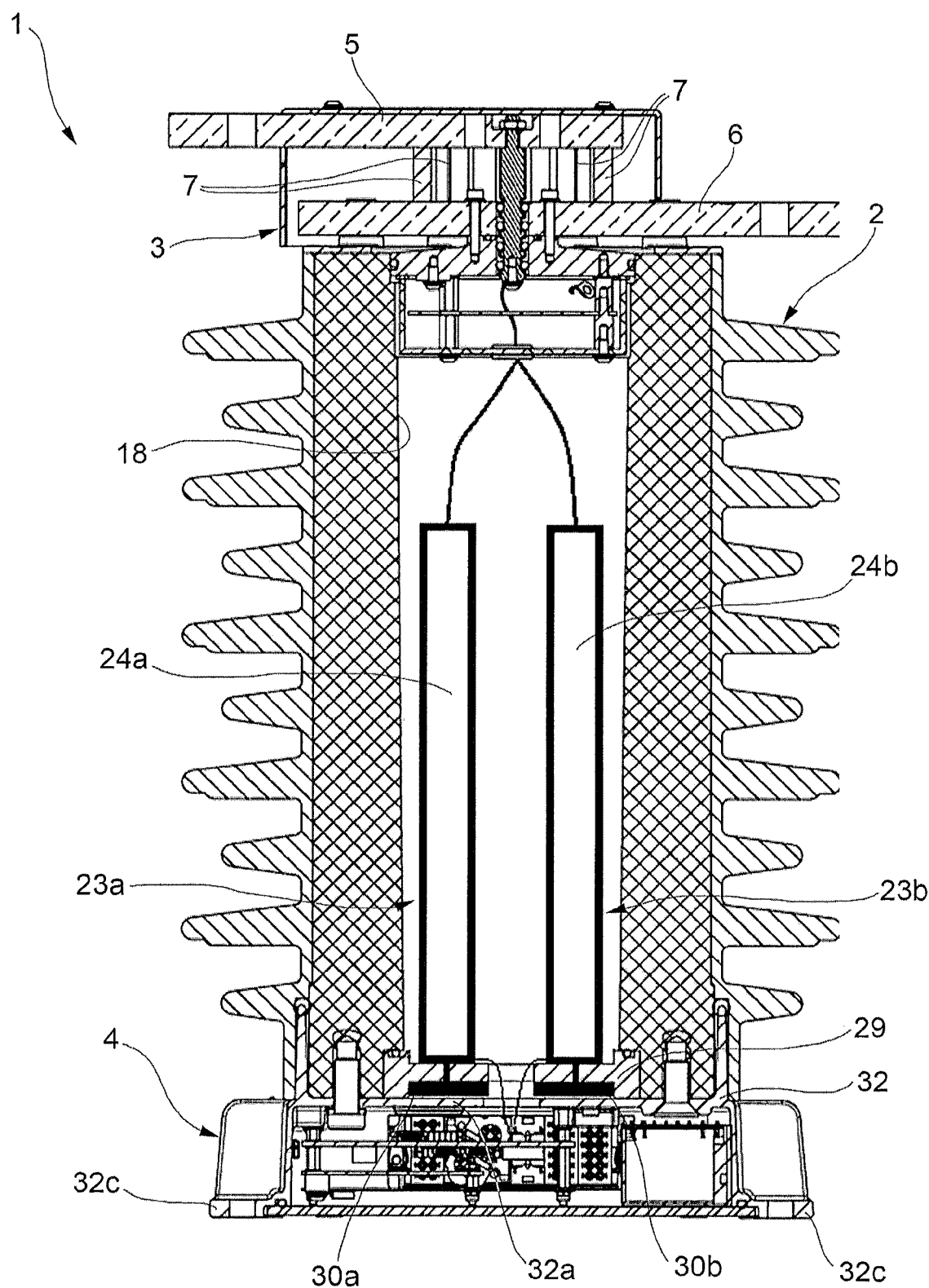
FIG. 3 is a vertical cross-section of an electrical-power measuring device according to the disclosed embodiments.

FIG. 2 shows schematically a block circuit diagram of a measuring device according to the present invention, whose overall structure is similar to the prior art one depicted in FIG. 1. FIG. 3 shows a vertical cross-section of the measuring device of FIG. 2.

With reference to FIGS. 1 and 3, the upper container 3 contains an upper horizontal metal plate 5 and a lower horizontal metal plate 6 that partially face one another (FIG. 2).

Between the facing portions of the plates 5 and 6 there is a plurality of pins 7 that are electrically connected to one another in parallel to jointly form a shunt resistor of predetermined value, for example around 10μΩ.

As shown schematically in FIG. 2, the upper metal plate 5 is designed to be operationally connected to a high-voltage electric supply line L, for example via a pantograph 8. Conversely, the lower metal plate 6 is designed to be connected to the traction motors.

As shown in FIG. 2, the plates 5 and 6, or the terminals of the shunt resistor formed by the pins 7 in parallel, are connected to the input of a processing and amplification circuit 9. This circuit 9 provides a signal indicating the AC voltage on the line L to an output 9a and a signal indicating the DC voltage on the line to an output 9b.

The signals outputted by the processing and amplification circuit 9 pass via respective amplifiers 10a, 10b to corresponding inputs of a block 11 acting as multiplexer and analogue/digital converter. This latter is connected to and controlled by a control and processing unit 12, provided for example using a field programmable gate array (FPGA), designed to generate signals or data indicating the intensity of the current drawn by the vehicle from the supply line L.

The control and processing unit 12 is connected to the input of a electrical/optical driver (converter) 13, the output of which is coupled to an optical fibre 14.

The unit 12 is also connected to the output of a electrical/optical receiver/converter 15, the input of which is coupled to an optical fibre 16.

Although in the diagram in FIG. 2 the processing and amplification circuit 9, the amplifiers 10a, 10b, the A/D converter-multiplexer 11, the unit 12 and the converters 13 and 15 are shown as being outside the insulator 2, in fact these devices (and others described below) are carried on a circuit board 17 mounted in the upper end portion of the axial cavity 18 formed in the insulator 2 (see FIG. 3).

With reference to FIG. 2, the direct supply voltages required by the devices carried on the circuit board 17 are obtained e.g. by a power laser receiver 19 that uses an optical fibre 20 to receive a power laser beam (for example 2 W), converting the optical energy into electrical energy, which it supplies to a supply-voltage management unit 21. The laser receiver 19 and the unit 21 are advantageously carried on the same circuit board 17.

In an embodiment not shown in the drawings, the optical fibres 14, 16 and 20 extend inside the cavity 18 of the insulator 2, from the converters 13, 15 and 19 carried on the board 17 to components (which are described below) seated inside the base body 4.

With reference to FIG. 2, the resistive voltage divider, indicated as a whole using reference sign 23, are connected between the board 5 and a terminal 22 that is designed to be connected to earth.

In the embodiment shown, the voltage divider 23 comprise a plurality of voltage dividers connected operationally to the supply line L and forming separate respective connection paths to the electrical grounding terminal 22. In the exemplary embodiment two voltage dividers 23a, 23b are shown connected in parallel, each one includes a respective upper resistor 24a, 24b and a lower measurement resistor 25a, 25b, connected together in series, each one comprising one or more resistors.

Each upper resistor 24a, 24b has a resistance between 40 MΩ and 60 MΩ and optionally of around 50 MΩ. The upper resistor 24a, 24b of each voltage divider 23a, 23b may have a different resistance value and the lower measurement resistor 25a, 25b of each voltage divider 23a, 23b may have a different resistance value.

A processor is connected to the outputs 26a, 26b of the voltage dividers 23a, 23b and configured to generate signals or data indicating the voltage of the supply line L. The processor comprises a plurality of separate processing modules each one coupled to a respective one of the connection paths and designed to generate respective signals or data indicating the voltage of the supply line L. FIG. 2 shows two processing modules 27a, 27b respectively coupled to the lower measurement resistor 25a, 25b. Each processing module 27a, 27b is arranged to acquire voltage readings of the voltage across the respective lower measurement resistor 25a, 25b along the corresponding connection path.

In the example embodiment shown, the upper resistor 24a, 24b of the voltage dividers 23a, 23b have respective upper ends connected to a metal connection member 28 and lower ends connected to respective lower metal bases 30a, 30b separated from each other.

Figure 4:
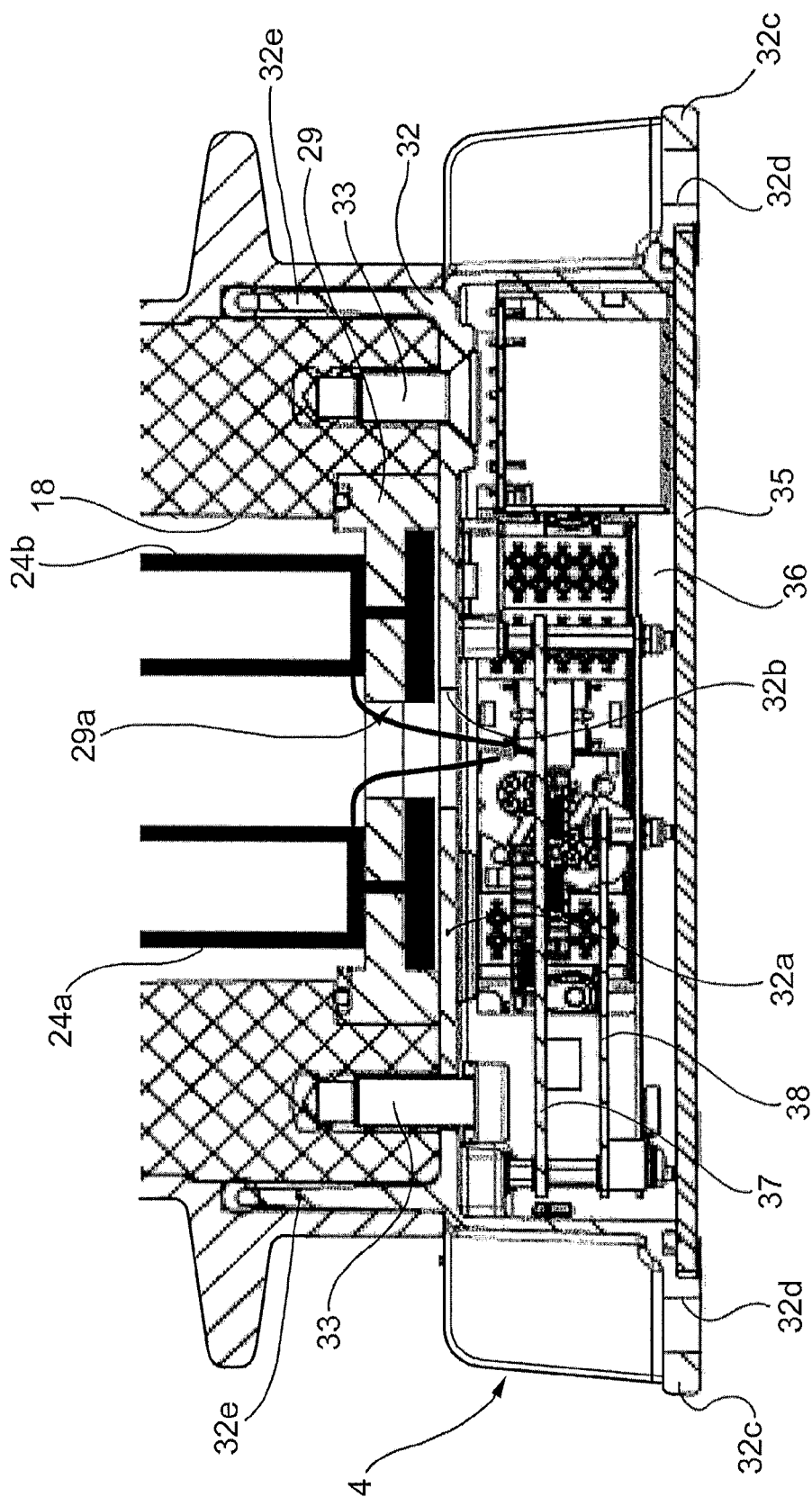
FIG. 4 is a partial magnified cut-out view of the lower portion in FIG. 3.

The low metal bases 30a, 30b are attached to an electrically insulating material 29, that is essentially disc shaped, that closes the bottom of the cavity 18 formed inside the insulator 2 (see also FIG. 4).

The disc-shaped element 29 has at least one central opening 29a.

As shown in FIGS. 3 and 4, the upper resistor 24a, 24b of the voltage dividers 23a, 23b extend completely inside the cavity 18 of the insulator 2.

With particular reference to FIG. 4, the low metal bases 30a, 30b are formed as plate-like members made of electrically conductive material, and are arranged at the lower face of the disc-shaped element 29.

The base 4 in the embodiment illustrated includes a metal body 32 substantially shaped like an inverted pan, the back wall 32a is attached to the lower end of the insulator 2 by bolts 33 or similar and also has a central opening 32b.

The body 32 is closed at the bottom by a cover, indicated using reference sign 35 in FIG. 4, in which the cavity or chamber formed inside the body 32 is indicated using reference sign 36.

In the embodiment illustrated, the lower portion of the body 32 has a pair of horizontal fins 32c projecting transversely outwards and including respective holes 32d used for attachment to an grounding conductor.

On the side opposite the fins 32c, the body 32 has a tubular cylindrical extension 32e, inserted into a corresponding annular hollow formed in the wall of the insulator 2 (see FIG. 4).

The central portion of the back wall 32a of the metal container 32 is oriented to face the plate-like members 30a, 30b, from which it is separated by a predetermined calibrated distance.

As a whole, the plate-like members 30a, 30b and the body 32 (and in particular the wall 32a of this latter) form a pair of separated dischargers, shown schematically and indicated using reference signs 40a, 40b in FIG. 2, between the terminals 30a, 30b with the lowest potential in the upper resistor 24a, 24b and earth E.

In the event of a surge that exceeds a predetermined value, between the plate-like members 30a, 30b and the wall 32a of the container 32, an electrical charge is generated that prevents damage being caused to the devices seated in the cavity 36 of the base 4, 32, which are described in greater detail below.

Two circuit boards 37 and 38, bearing various different devices and that are described below with reference to the diagram in FIG. 2, are assembled in the cavity 36 formed in the base 4, or inside the pan-shaped body 32.

As shown in this diagram, the measurement resistor 25a, 25b, which have a resistance between 2 kΩ and 4 kΩ and optionally, for example, approximately 3 kΩ, are assembled in the base 4.

Respective amplifiers 41a, 41b are connected across the resistor 25a, 25b, the output of the amplifiers being connected to respective A/D converters 42a, 42b, coupled to respective control and processing units 43a, 43b, which are also for example FPGAs. The control and processing units 43a, 43b are arranged for calculating data indicating the voltage of the line L, based on the voltage readings acquired by each processing module 27a, 27b.

The processor within the base 4 includes an evaluation module 50 arranged to compare the data indicating the voltage of the line L calculated by each control and processing unit 43a, 43b between them. A difference between the calculated data, greater than a predetermined threshold, is indicative of an abnormality.

The processor within the base 4 is further arranged for calculating the power drawn by the supply line L, as a function of the generated signals or data indicating the intensity of the current drawn by the vehicle from the supply line L and of the generated signals or data indicating the voltage of the supply line L. For this purpose, a receiver 52, such as an electrical/optical converter is provided, the input of which is connected to the optical fibre 14 through which the control and processing unit 12 sends data indicating the intensity of the current measured using the shunt resistor 5-7.

The output of the receiver 52 is connected to a calculation unit 54, formed for example using a DSP device and a microcontroller, which also receives the data sent by the units 43*a*, 43*b* or data related thereto, such as average data, indicating the voltage of the line L, measured using the voltage dividers 23*a*, 23*b*.

The calculation unit 54 is also connected to a transmitter, such as an electrical/optical converter (not shown), the output of which is connected to the optical fibre 16 in order to send synchronism data to the control and processing unit 12.

Various other devices may be provided inside the base 4, such as a power unit used to supply voltage to the different devices in the base 4, an electrical/optical transmitter/converter with an optical fibre output for connection to external equipment, a UART unit for connecting external devices, a network communication interface (for example Ethernet), an interface, for example an RS-485 interface, and a relay output.

The electrical connections of the devices inside the base 4 with the "outside world" can advantageously be provided using a multi-pole electrical connector, such as the one indicated using reference sign C in FIG. 1.

The base 4 also includes an energy source in the form of a source of optical radiation, such as a solid-state laser generator for generating a power laser beam or one or more LEDs.

When in operation, the measuring device 1 described above works essentially in the following manner:

The devices carried on the circuit board 17, which is positioned in the upper portion of the internal cavity of the insulator 2, measure the intensity of the current drawn by the line L using the resistive shunt device 5-7. The control and processing unit 12 sends corresponding data to the calculation unit 54 positioned in the base 4 of the measuring device 1 via the electrical/optical converter 13, the optical fibre 14 and the optical/electrical converter or receiver 52 within the base.

The calculation unit 54 also acquires data indicating the voltage of the line L via the voltage dividers 23*a*, 23*b* and the evaluation module 50.

The calculation unit 54 can then calculate the power drawn by the line L, which is essentially proportional to the product of the intensity of the current drawn and of the voltage on the line. Using information on the absorbed power, the calculation unit 54 can also calculate how much energy is being drawn by the line L over a given time period, calculating the integral of the product of the power multiplied by time.

In the event of a surge greater than a predetermined value, the dischargers 40*a*, 40*b* independently or together generate a discharge to earth, thereby protecting all of the devices carried on the base 4 of the measuring device 1.

Naturally, notwithstanding the invention principle, the implementation and the specific embodiments may vary greatly from that described and illustrated purely by way of a non-limiting example, without thereby moving outside the scope of the invention as defined in the attached claims.

The invention claimed is:

1. A device for measuring the electric power delivered to a railway vehicle by a high voltage electric supply line, the device comprising:
a resistive voltage divider connected operationally in parallel between the supply line and an electric grounding terminal, and
a processor connected to the output of the voltage divider and configured to generate signals or data indicating the voltage of the supply line,
wherein the resistive voltage divider comprises a plurality of voltage dividers connected operationally to the supply line and forming separate respective connection paths to the electrical grounding terminal so that each of the plurality of voltage dividers operates independently,
wherein the processor comprises a plurality of separate processing modules each one coupled to a respective one of the connection paths and configured to generate respective signals or data indicating the voltage of the supply line, and
wherein the voltage divider is arranged in a cavity inside a line insulator and the terminal with the lowest potential of each voltage divider is arranged at a predetermined distance from a body made of electrically conductive material, arranged at a lower end of the insulator and outside the cavity of the insulator, which body is adapted to be operatively connected to ground and in which body there are arranged the processor to form therewith respective separate dischargers capable of generating an electric discharge when the voltage across at least one of the dischargers exceeds a predetermined value.

2. The device of claim 1, wherein each voltage divider includes an upper voltage drop resistor and a lower measurement resistor connected in series along a respective connection path, and each processing module being arranged to acquire voltage readings of the voltage across respective lower measurement resistor means along a respective connection path.

3. The device of claim 2, wherein each processing module includes an amplifier connected across the respective lower measurement resistor, the output of the amplifier being coupled through an A/D converter to a control and processing unit configured to calculate data indicating the voltage of the line based on the voltage readings.

4. The device of claim 3, wherein the processor includes an evaluation module configured to compare the data indicating the voltage of the line calculated by each control and processing unit between them, wherein a difference between the calculated data, greater than a predetermined threshold, is indicative of an abnormality.

5. The device of claim 1, wherein the upper resistor of each voltage divider has a different resistance value and the lower measurement resistor means of each voltage divider has a different resistance value.

6. The device of claim 1, wherein each terminal with the lowest potential of each voltage divider is connected to a respective plate-like member made of electrically conductive material that extends outside the cavity of the insulator, and the body made of electrically conductive material, arranged at a lower end of the insulator, is a hollow body, the hollow body including a plate-like wall arranged to face the plate-like members at a predetermined distance therefrom.

7. The device of claim 1, further comprising a plurality of current sensors connected operationally to the supply line and a plurality of second processors connected to the current sensors and configured to generate signals or data indicating an intensity of the current drawn by the vehicle from the supply line, wherein the second processor are further configured to calculate the power drawn by the supply line as a function of the generated signals or data indicating the intensity of the current drawn by the vehicle from the supply line and of the generated signals or data indicating the voltage of the supply line.

* * * * *